United States Patent
Jacob et al.

(10) Patent No.: US 9,136,462 B2
(45) Date of Patent: Sep. 15, 2015

(54) METHOD OF MANUFACTURING A CONDUCTIVE ADHESIVE BOND ASSEMBLY

(75) Inventors: Joern Jacob, Kirnbach (DE); Holger Gruhler, Tuningen (DE)

(73) Assignee: VEGA GRIESHABER KG, Wolfach (DE)

( * ) Notice: Subject to any disclaimer, the term of this patent is extended or adjusted under 35 U.S.C. 154(b) by 66 days.

(21) Appl. No.: 13/301,996

(22) Filed: Nov. 22, 2011

(65) Prior Publication Data

US 2012/0194035 A1 Aug. 2, 2012

Related U.S. Application Data

(60) Provisional application No. 61/440,585, filed on Feb. 8, 2011.

(30) Foreign Application Priority Data

Feb. 1, 2011 (EP) ..................................... 11000774

(51) Int. Cl.
*H01L 41/22* (2013.01)
*H05K 3/36* (2006.01)
(Continued)

(52) U.S. Cl.
CPC ............ *H01L 41/29* (2013.01); *G01F 23/2965* (2013.01); *G01F 23/2967* (2013.01); *G01F 23/2968* (2013.01); *H01L 41/0475* (2013.01);
(Continued)

(58) Field of Classification Search
CPC ....... H01L 41/22; H01L 41/29; H01L 41/293; H01L 41/0475; H05K 3/3478; H05K 3/363; H05K 3/326; H05K 3/321; H05K 1/189; B41J 2202/18; B41J 2202/19; B41J 2202/20; G01F 23/2968; G01F 23/2965; G01F 23/2967; Y10T 29/42
USPC .................. 29/25.35, 890.1, 840, 843, 852; 310/328, 331, 342, 345; 347/68, 70, 71
See application file for complete search history.

(56) References Cited

U.S. PATENT DOCUMENTS 6,374,487 B1 * 4/2002 Haba et al. ...................... 29/840
6,472,610 B1 10/2002 Kawabata
(Continued)

FOREIGN PATENT DOCUMENTS

CN 1505 844 6/2004
CN 1650 680 8/2005
(Continued)

OTHER PUBLICATIONS

EP Pat. Appln. Serial No. 11000774.7 Search Report mailed Nov. 2, 2011, 7 pages (German), 4 pages (English).
CN 201110424595.X, Office Action mailed Dec. 24, 2014, 10 pages—English; 7 pages—Chinese.

*Primary Examiner* — A. Dexter Tugbang
(74) *Attorney, Agent, or Firm* — Andrew F. Young, Esq.; Lackenbach Siegel, LLP

(57) ABSTRACT

A method of manufacturing a conductive adhesive bond assembly consisting of a piezoactuator and a printed circuit board that are connected by at least one adhesive connection, with at least one electrical connection created by an electrically conductive adhesive between a first connection contact on the printed circuit board and between a second connection contact on the piezoactuator, whereby the connection contacts face in the same direction and the adhesive connection takes place through an opening in one of the components.

16 Claims, 2 Drawing Sheets

(51) Int. Cl.
*H01L 41/29* (2013.01)
*H01L 41/293* (2013.01)
*G01F 23/296* (2006.01)
*H01L 41/047* (2006.01)
*H05K 1/18* (2006.01)
*H05K 3/34* (2006.01)
*H05K 3/32* (2006.01)

(52) U.S. Cl.
CPC .............. *H01L 41/22* (2013.01); *H01L 41/293* (2013.01); *H05K 1/189* (2013.01); *B41J 2202/18* (2013.01); *B41J 2202/19* (2013.01); *B41J 2202/20* (2013.01); *H05K 3/321* (2013.01); *H05K 3/326* (2013.01); *H05K 3/3478* (2013.01); *H05K 3/363* (2013.01); *Y10T 29/42* (2015.01)

(56) References Cited

U.S. PATENT DOCUMENTS

| | | | |
|---|---|---|---|
| 6,891,314 B2 * | 5/2005 | Sato et al. | 310/328 |
| 7,004,565 B2 * | 2/2006 | Suzuki et al. | 347/71 X |
| 7,467,468 B2 * | 12/2008 | Imai | 29/890.1 |
| 2010/0165515 A1 | 7/2010 | Ando | |

FOREIGN PATENT DOCUMENTS

| | | | |
|---|---|---|---|
| CN | 1 729 387 | | 2/2006 |
| DE | 10126655 | | 12/2002 |
| DE | 10126656 | | 12/2002 |
| DE | 10260088 | | 8/2004 |
| JP | 60054486 | | 3/1985 |
| JP | 10308997 A | * | 11/1998 |

\* cited by examiner

METHOD OF MANUFACTURING A CONDUCTIVE ADHESIVE BOND ASSEMBLY

CROSS REFERENCE TO RELATED APPLICATIONS

This application claims priority from European Patent App. Ser. No. 11 000 774.7 filed Feb. 1, 2011 and from U.S. Prov. Ser. No. 61/440,585, the entire contents of each of which are incorporated herein by reference.

FIGURE SELECTED FOR PUBLICATION

FIG. 3

BACKGROUND OF THE INVENTION

1. Field of the Invention

The present invention relates to an arrangement and process for bonding a piezoactuator and a printed circuit board. More specifically, the present invention relates to an arrangement and process for bonding a piezoactuator and a printed circuit board utilizing an electrically conductive adhesive between a first contact on the piezoactuator and a second contact on the printed circuit board with enhanced reliability and security.

2. Description of the Related Art

Arrangements are known consisting of a piezoactuator and a printed circuit board and are used, for example, in so-called vibration boundary state measuring apparatuses. The schematic construction of such a vibration boundary state measuring apparatus is shown in FIG. 1; and, is neither true to scale nor complete and is intended solely to show the function of a vibration boundary state measuring apparatus in the manner of a diagrammatic sketch.

The vibration boundary state measuring apparatus shown comprises an oscillating fork 11 as measuring sensor which fork is arranged on a membrane 9. Membrane 9 is part of oscillating fork 11, whereby prongs 11a, 11b of the oscillating fork are directly bound on membrane 9 and are move to and from one another by bending membrane 9.

Membrane 9 is manufactured as a rule from high-grade steel and can be put in oscillation by a piezoactuator. Piezoactuator 1 is connected via a ceramic platelet 7 arranged between piezoactuator 1 and membrane 9 to the latter. Ceramic platelet 7 is provided in order to adapt the different thermal coefficients of expansion of membrane 9 and of piezoactuator 1 to each other.

An exciting of piezoactuator 1 takes place via an electrical voltage that is supplied via a printed circuit board 3 on the top of piezoactuator 1. A bottom of piezoactuator 1 is continuously metallized so that a voltage applied to the surface brings about an oscillation of piezoactuator 1 on account of a segmentation of the electrode on the top side as well as on account of a different polarization of these piezosegments. Printed circuit board 3 is constructed in the present example as a so-called flexline, i.e., as a flexibly constructed printed circuit board with conducting tracks arranged on it in a manner known to those of skill in the art.

Flexline 3 is connected at the points to be contacted of piezoactuator 1 via conductive adhesive to the latter so that a voltage is introduced into piezoactuator 1 exclusively at the points connected by the adhesive. Piezoactuator 1 as well as ceramic platelet 7 and membrane 9 are also adhered to each other.

In order to produce a vibration of oscillating fork 11 with piezoactuator 1 and at the same time to detect a frequency shift or damping of oscillating fork 11, piezoactuator 1 is divided into four segments, not shown but as will be understood by those of skill in the art. Piezoactuator 1 is constructed as a rule in a circular manner in a top view and subdivided into four quadrants that can be individually regulated by applying a voltage. In order to produce an oscillation, two diagonally opposite quadrants are loaded with a voltage while the other two quadrants are used to detect the produced oscillation. In this manner, an oscillation can be simultaneously produced and detected.

FIG. 2 shows the arrangement consisting of piezoactuator 1 and printed circuit board as it is customary in the state of the art. Printed circuit board 3 (or the "flexline") has a first connection contact 13 for applying the voltage on piezoactuator 1. A second connection contact 15 is provided on piezoactuator 1 corresponding to the first connection contact 13. In order to produce an electrical as well as a mechanical connection between flexline 3 and piezoactuator 1, it is customary according to the state of the art to produce an electrically conductive adhesive connection 5 between the first connection contact and the second connection contact. It is currently customary in the state of the art to first apply the electrically conductive adhesive on connection contacts 15 of piezoactuator 1 and to subsequently arrange flexline 3, suitably aligned, on the latter and to adhere it to piezoactuator 1.

This conventional practice has several detriments that have no resolution. Due to the small adhesive surface and the subsequent pressing, an amount of adhesive must be very small and dimensioned very precisely. An exactly reproducible dosing of a very small amount of a highly viscous medium can only be achieved with difficulty due to the surface forces dominating in small volumes, so that there is an elevated production cost and a detrimental related defect rate.

This procedure has the further operative problem that a false alignment of flexline 3 in the first attempt can no longer be corrected since otherwise the conductive adhesive is falsely smeared between connection contacts 13, 15 and as a consequence short circuits between individual contacts must be reckoned with. It is furthermore a detriment to operability that flexline 3 and piezoactuator 1 cannot be arranged directly on top of one another on account of adhesive connection 5 between them. This arrangement creates necessarily a space or gap (shown in FIG. 2) which further is an operative detriment. It is moreover negative that when flexline 3 and piezoactuator 1 are pressed together, adhesive connection 5, located between them, is pressed flat and as a result any excessive adhesive is pressed out laterally next to connection contacts 13, 15. This, in turn, increases the risk and the danger of short circuits.

As a further operative concern, on account of the purely material connection between flexline 3 and piezoactuator 1 in FIG. 2 every later loading of adhesive connection 5 must be taken up by forces of cohesion and adhesion.

What is not appreciated by the prior art is that after the application of the adhesive, the flexline 3 must be positioned plane parallel and exactly to piezoactuator 1. For the reasons presented above, a subsequent correction of any mis-positioning is not possible and is a further operative detriment.

The present invention has the problem of eliminating the above-described disadvantages and of simplifying the carrying out of the process in the manufacture of the described arrangement.

Accordingly, there is a need for an improved arrangement and process for bonding a piezoactuator and a printed circuit board utilizing an electrically conductive adhesive between a first contact on the piezoactuator and a second contact on the printed circuit board.

ASPECTS AND SUMMARY OF THE INVENTION

The present invention relates to an arrangement and process and system for producing a conductive adhesive connection between a printed circuit board with a first connection contact and a piezoactuator with a second connection contact. The printed circuit board is connected by at least one adhesive connection, with at least one electrical connection created by an electrically conductive adhesive between the first connection contact on the printed circuit board and between a second connection contact on the piezoactuator. The connection contacts face in the same direction; and, the adhesive connection takes place through an opening in one of the components.

An aspect of the present invention is to provide an improved arrangement and process for bonding a piezoactuator and a printed circuit board utilizing an electrically conductive adhesive between a first contact on the piezoactuator and a second contact on the printed circuit board with no related remaining space between the circuit board and the piezoactuator following assembly.

Another aspect of the present invention is to provide a positive, rivet-like adhesive connection that is very loadable is achieved by an appropriate arrangement. As a result of the fact that the piezoactuator and the printed circuit board can be exactly aligned relative to one another before the adhering, it is not necessary to perform a correction of position after the application of the adhesive. Since a false smearing of adhesive can be avoided in this manner, short circuits between individual connection contacts are largely avoided. Furthermore, an amount of adhesive used for the adhesive connection can be increased and in addition must be less precisely dosed.

An especially advantageous arrangement results if the printed circuit board is arranged on the piezoactuator. Moreover, it is advantageous if the printed circuit board is constructed as a flexible printed circuit board.

It is achieved by a flexible printed circuit board, or a so-called flexline, that the piezoactuator can on the one hand be adhered readily to the printed circuit board and on the other hand a flexible signal feed line and shunt line nevertheless become possible.

An advantageous possibility for producing electric contacts is present if the first connection contact is designed as an annulus. The arrangement is especially advantageous if the second connection contact is designed like a circle.

If the opening for the adhering is arranged inside of the connection contact designed as an annulus, or other similar geometric bounded region, also recognized here as a bounded opening, this can bring it about that in addition to a mechanically very loadable connection a good electrical connection can also be established between the first connection contact on the flexline and between the second connection contact on the piezoactuator.

A especially advantageous mechanical design is achieved if the piezoactuator and the printed circuit board are arranged directly on top of one another. In this manner, an areal arrangement of flexline and piezoactuator is achieved, whereby no air gap remains between the two components. Such an arrangement is advantageous, because if the components are arranged directly on top of one another, no lever forces are to be expected on the edges of the adhesion so that the connection created in this manner is mechanically highly stable.

An especially stable embodiment of the adhesive connection is achieved if the adhesive covers the connection surfaces in the manner of a dome. This type of adhesive connection is advantageous since in this manner a circular surface is formed on the piezoactuator and an annular surface is formed on the flexline, that are each covered by the adhesive.

It is especially advantageous for the present application if the piezoactuator is segmented four times and an adhesive connection is provided in each case. It is achieved by a piezoactuator that is designed in a circular form and segmented four times and in which each segment can be individually controlled, that an oscillation is simultaneously produced by regulating two diagonally opposite segments of the piezoactuator and can be detected at the same time with the remaining two segments. However, it is also conceivable to also use an adhesive connection in accordance with the invention in other areas of application in which a flexline is to be arranged on an element located underneath it.

In the process in accordance with the invention for producing a conductive adhesive connection between a printed circuit board with a first connection contact and a piezoactuator with a second connection contact, whereby the printed circuit board has an opening in the area of the connection contact, in a first step the printed circuit board and the piezoactuator are arranged aligned with one another. In a second step, a suitable amount of conductive adhesive is applied onto the connection contacts in such a manner that a connection is established between the latter; and, in a third step the adhesive connection is hardened.

In contrast to the state of the art, the process in accordance with the invention has the advantage that the printed circuit board and the piezoactuator can be aligned relative to one another before the application of the adhesive and in this manner a subsequent correcting of a possibly defective alignment can be avoided. Furthermore, the process has the advantage that it is not necessary to press the individual adhesive components with adhesive arranged between them, so that it is avoided that adhesive is distributed beyond the actual surface to be adhered. In this manner, short circuits through the conductive adhesive that could possibly swell out during the pressing are avoided. Moreover, another advantage of the process in accordance with the invention is the fact that the amount of the conductive adhesive used for the adhering can be dimensioned to be larger and can be measured less precisely. In this manner, the assembly process is considerably simplified.

It is advantageous for the quality of the achieved adhesive connection if the printed circuit board and the piezoactuator are pressed onto one another before the application of the adhesive. It is avoided in this manner that the adhesive moves into the intermediate space between piezoactuator and printed circuit board in a capillary manner during the application; and, that in this manner, short circuits could occur.

It is advantageous to apply enough adhesive so that the adhesive covers the connection contacts like a dome. In this manner an especially stable adhesive connection is achieved that is furthermore very simple to produce.

In order to establish an especially preferable electrical connection between the connection contacts it is advantageous if the first connection contact is formed in an annulus around the opening and/or the second connection contact is formed in a circle. It is achieved in this manner that a conductive adhesive connection establishes an electrical contact in every direction and thus makes possible a reliable and low-loss coupling in of the voltage on the piezoactuator.

The above, and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
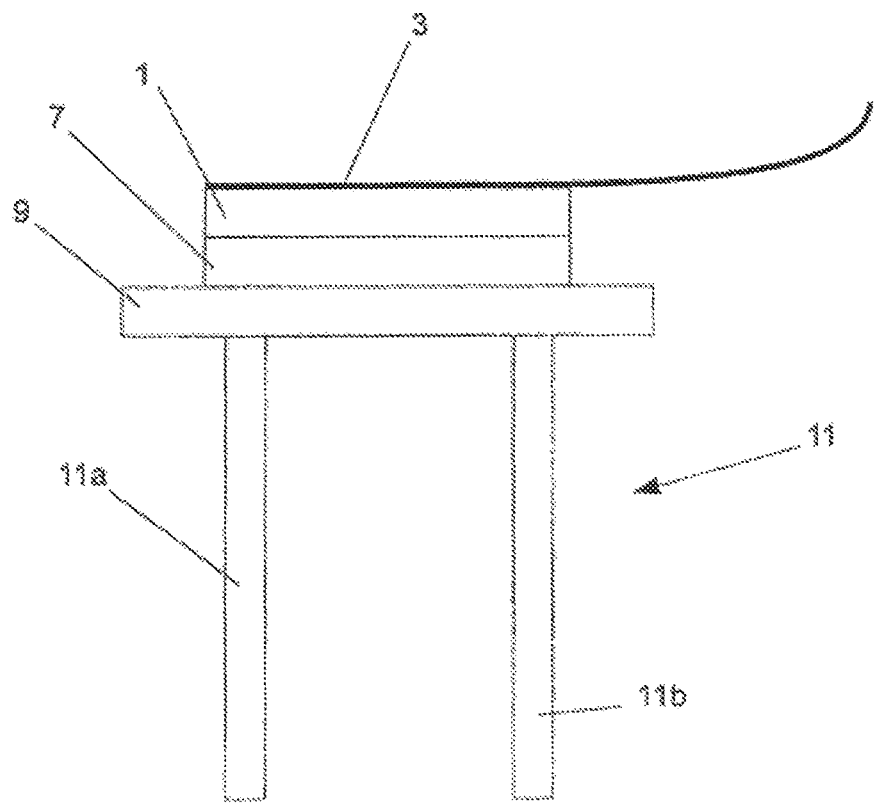
FIG. 1 shows a schematic construction of a vibration boundary state measuring apparatus (in the conventional art).
Figure 2:
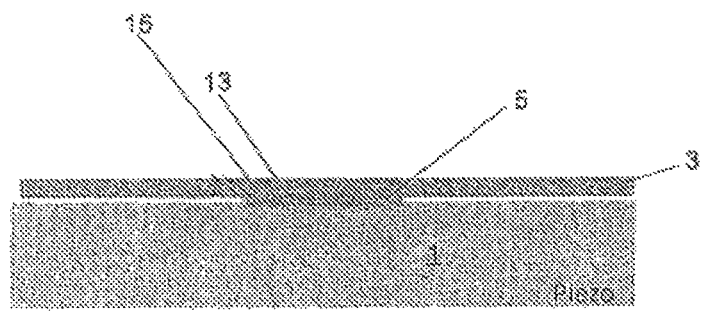
FIG. 2 shows a conductive adhesive connection in accordance with the state of the art (in the conventional art).

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Figure 3:
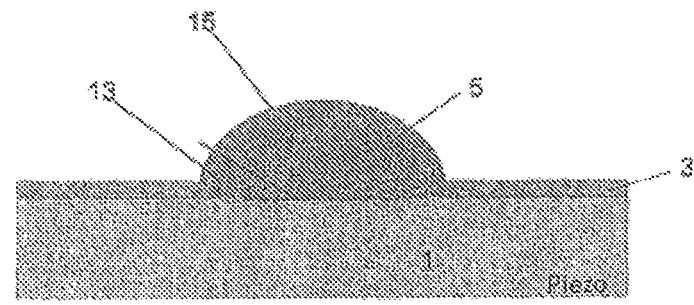
FIG. 3 shows an adhesive connection in accordance with the invention.

FIG. 3 shows an adhesive connection 5 in accordance with the present invention between a piezoactuator 1 and a printed circuit board 3. Printed circuit board 3 is constructed in the present example as a so-called flexline, i.e. as a flexibly constructed printed circuit board with conductive tracks arranged on it. Flexline 3 is arranged directly on piezoactuator 1 and comprises an annular first connection contact 13 arranged on the side of flexline 3 facing away from piezoactuator 1.

Flexline 3 has an opening inside first connection contact 13 inside which opening a second connection contact 15 is positioned that is arranged on piezoactuator 1. Piezoactuator 1 and flexline 3 are connected to one another by an adhesive connection 5. Adhesive connection 5 is manufactured from an electrically conductive adhesive in such a manner that it covers connection contacts 13, 15 and thus forms an adhesive connection 5 shaped like a rivet in cross section.

The arrangement of piezoactuator 1 and flexline 3 formed in this manner is preferably used in vibration boundary state measuring apparatuses like those known from the state of the art.

Connection contacts 13, 15 on flexline 3 and piezoactuator 1 can be formed, for example, by an applied layer of gold. The adhesive used for adhesive connection 5 can be compounded, e.g., with particles of silver so that an electrical conductivity is ensured.

It will be understood by those of skill in the related arts having studied and understood the present discussion that the system and method may be accomplished in a manner without departing from the scope and spirit of the present invention.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

LIST OF REFERENCE NUMERALS 1 piezoactuator
3 printed circuit board/flexline
5 adhesive connection
7 ceramic platelet
9 membrane
11 oscillating fork
11a, b prongs
13 first connection contact
15 second connection contact

What is claimed is:

1. A method for producing a conductive adhesive connection between a printed circuit board with a first connection contact and a piezoactuator with a second connection contact, said method whereby said printed circuit board is provided with a bounded opening in the area of said first connection contact, said method comprising the steps of:
   (a) establishing an aligned arrangement of the printed circuit board and the piezoactuator with one another, wherein said piezoactuator and said printed circuit board are arranged directly on top of one another, wherein the printed circuit board is adhered directly to the piezoactuator and the printed circuit board and the piezoactuator are in contact with one another so that no air gap remains between said printed circuit board and said piezoactuator;
   (b) applying a suitable amount of conductive adhesive onto said first and said second connection contacts, after establishing the aligned arrangement of the printed circuit board and the piezoactuator, in such a manner that the conductive adhesive connection is established between said first and second connection contacts;
   (c) said conductive adhesive at least in part in said bounded opening; and
   (d) hardening said conductive adhesive connection.

2. The method according to claim 1, further comprising the step of pressing said printed circuit board and said piezoactuator against one another before the application of said conductive adhesive.

3. The method of claim 1, further comprising the step of covering said first and said second connection contacts with enough of said conductive adhesive so as to form a dome.

4. The method of claim 1, wherein said first connection contact is constructed in the shape of an annulus.

5. The method of claim 4, wherein said bounded opening is arranged inside said annular first connection contact.

6. The method of claim 1, wherein said printed circuit board is constructed as a flexible printed circuit board.

7. The method of claim 1, wherein said piezoactuator is segmented four times, and an adhesive connection is provided for each of said segments.

8. A method for producing a conductive adhesive connection between a printed circuit board having a first connection contact and a piezoactuator having a second connection contact, wherein said printed circuit board is provided with a bounded opening in the area of said first connection contact, said method comprising the steps of:

(a) aligning said printed circuit board and said piezoactuator with one another, wherein said piezoactuator and said printed circuit board are arranged directly on top of one another, wherein the printed circuit board is adhered directly to the piezoactuator and that the printed circuit board and the piezoactuator are in contact with one another so that no air gap remains between said printed circuit board and said piezoactuator;

(b) pressing said printed circuit board and said piezoactuator against one another before application of a conductive adhesive;

(c) applying said conductive adhesive onto said first and said second connection contacts in such a manner that said conductive adhesive connection is established therebetween, after the step of aligning said printed circuit board with said piezoactuator, wherein said conductive adhesive is at least in part in said bounded opening;

(d) hardening said adhesive connection; and (e) wherein said first connection contact is constructed in the shape of an annulus.

9. The method of claim 8, further comprising the step of covering said first and said second connection contacts with enough adhesive so as to form a dome.

10. The method of claim 8, wherein said opening is arranged inside said annular first connection contact.

11. The method of claim 8, wherein said printed circuit board is constructed as a flexible printed circuit board.

12. The method of claim 8, wherein said piezoactuator is segmented four times, and an adhesive connection is provided for each of said segments.

13. A method for producing a conductive adhesive connection between a printed circuit board with a first connection contact and a piezoactuator with a second connection contact, wherein said printed circuit board is provided with a bounded opening in the area of said first connection contact, said method comprising the steps of:

(a) aligning said printed circuit board with said piezoactuator, wherein said piezoactuator and said printed circuit board are arranged directly on top of one another, wherein the printed circuit board is adhered directly to the piezoactuator such that the printed circuit board and the piezoactuator are in contact with one another so that no air gap remains between said printed circuit board and said piezoactuator;

(b) pressing said printed circuit board and said piezoactuator against one another;

(c) applying a conductive adhesive onto at least one of said first or said second connection contacts, after the step of aligning said printed circuit board with said piezoactuator, in such a manner that an adhesive connection is established between said first and said second connection contacts, wherein said conductive adhesive is partially within said bounded opening; and (d) allowing said adhesive connection to harden;

wherein said piezoactuator is segmented at least four times, and an adhesive connection is provided for each said piezoactuator segment.

14. The method of claim 13, further comprising the step of covering said first and said second connection contacts with enough adhesive so as to form a dome.

15. The method of claim 13, wherein said first connection contact is constructed in the shape of an annulus.

16. The method of claim 13, wherein said second connection contact is constructed in the shape of a circle.

* * * * *